United States Patent
Rotay

Patent Number: 5,457,422
Date of Patent: * Oct. 10, 1995

[54] DEVICE FOR BIASING AN RF DEVICE OPERATING IN QUASI-LINEAR MODES WITH VOLTAGE COMPENSATION

[75] Inventor: Craig J. Rotay, Lansdale, Pa.

[73] Assignee: SGS-Thomson Microelectronics, Inc., Carrollton, Tex.

[*] Notice: The portion of the term of this patent subsequent to Oct. 18, 2011 has been disclaimed.

[21] Appl. No.: 268,858

[22] Filed: Jun. 30, 1994

Related U.S. Application Data

[63] Continuation of Ser. No. 998,122, Dec. 29, 1992.

[51] Int. Cl.$^6$ .................................. H03L 5/00; G05F 1/10
[52] U.S. Cl. ..................... 327/538; 327/362; 327/312; 327/306; 327/512
[58] Field of Search ....................... 302/491, 546, 302/264, 310, 296.6; 327/538, 362, 312, 306, 512

[56] References Cited

U.S. PATENT DOCUMENTS

| | | | |
|---|---|---|---|
| 3,501,710 | 3/1970 | Liepins et al. | 330/22 |
| 3,984,783 | 10/1976 | Bickley | 330/40 |
| 4,924,194 | 5/1990 | Opas et al. | 330/289 |

FOREIGN PATENT DOCUMENTS 1487397 7/1969 Germany.

*Primary Examiner*—Margaret Rose Wambach
*Attorney, Agent, or Firm*—Allan Ratner; Renee M. Larson; Lisa K. Jorgenson

[57] ABSTRACT

A biasing device for actively biasing the base of an RF device operating in quasi-linear modes. The biasing device provides a source of low-impedance current and high current capability. The biasing device includes three transistors, each having a base, collector and emitter and one low turn-on diode. The first and second transistors are connected such that changes in the base-emitter voltage of the biased RF device can be detected. The third transistor is configured in a Darlington configuration with the first transistor in order to provide (1) increased sensitivity to voltage changes detected by the second transistor and (2) additional collector voltage for the second transistor to prevent it from operating in saturation. The low turn-on diode is a compensating diode which thermally tracks and compensates for operating changes in the second transistor due to temperature.

9 Claims, 3 Drawing Sheets

DEVICE FOR BIASING AN RF DEVICE OPERATING IN QUASI-LINEAR MODES WITH VOLTAGE COMPENSATION

This is a continuation of application Ser. No. 07/998,122, filed Dec. 29, 1992.

FIELD OF THE INVENTION

The present invention relates generally to a circuit for biasing an RF device and, more particularly, to a circuit using three transistors and a low turn-on diode for actively biasing an RF device operating in quasi-linear modes by sensing and tracking the base-emitter voltage changes of the RF device.

BACKGROUND OF THE INVENTION

It is well-known that RF devices operating in quasi-linear modes require biasing circuitry. In these modes, effective biasing circuitry should supply the RF device with its current requirements while accounting for drifts in the RF device's operating point due to temperature variations. These changes in operating point typically result in degraded amplifier performance and, furthermore, if uncontrolled, the drifting due to temperature may lead to catastrophic device failure (i.e., "thermal runaway").

Thus, the effectiveness of a biasing device is related to its current supply capability, its internal resistance (which also affects it current supply capability) and its ability to prevent thermal runaway (caused by uncontrolled drifting of the operating point). Additional considerations for determining the usefulness and appeal of a biasing device include the amount of space it consumes, the need for support devices, and the effects on total amplifier efficiency, linearity, stability and reliability.

Traditional biasing techniques such as resistive voltage division, diode bias or bypassed emitter bias can no longer satisfy the aggressive specifications imposed on RF transistors without substantial reduction in total system efficiency and/or common-emitter power gain.

SUMMARY OF THE INVENTION

The present invention involves a biasing device for actively biasing the base of an RF device operating in quasi-linear modes. The biasing device provides a source of low impedance current and high current capability. The biasing device includes first and second transistors, each having a base, collector and emitter. The base of the first transistor is connected to the collector of the second transistor by way of a semiconductor device for increasing the collector voltage of the second transistor. The emitter of the first transistor is connected to one side of a resistor and the base of the RF device. The base of the second transistor is connected to the other side of said resistor.

Further in accordance with the present invention, a diode is connected between the base of the second transistor and ground in order to thermally compensate for the second transistor.

BRIEF DESCRIPTION OF THE DRAWINGS

The invention is best understood from the following detailed description when read in connection with the accompanying drawings, in which:

FIG. 2 is an illustration of the diamond matrix architecture used for processing the transistors in FIG. 1a;

FIG. 3 is an illustration of the interdigitated architecture used for processing the diode in FIG. 1a;

FIG. 4 is an illustration of the exemplary embodiment of the diode in FIG. 1a;

FIG. 6 shows an alternate embodiment of the biasing device of FIG. 1a; and

DETAILED DESCRIPTION OF THE INVENTION

A. Definition

Within this specification, the following terms or phrases have the corresponding definitions:

RF device. RF NPN Bipolar Transistor.

Quasi-linear modes. Modes of operation during which the conduction angle in a common emitter configuration falls at or between 180° and 360°. These modes are generally referred to as classes $AB_1$, $AB_2$ and B.

B. Overview

Figure 1A:
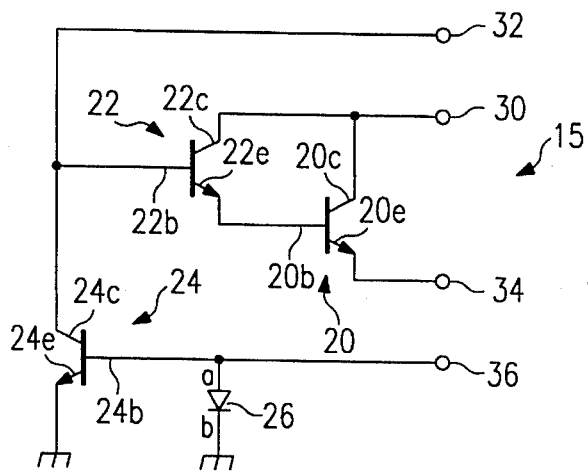
FIG. 1a is a circuit diagram of a biasing device in its basic configuration.
Figure 1B:
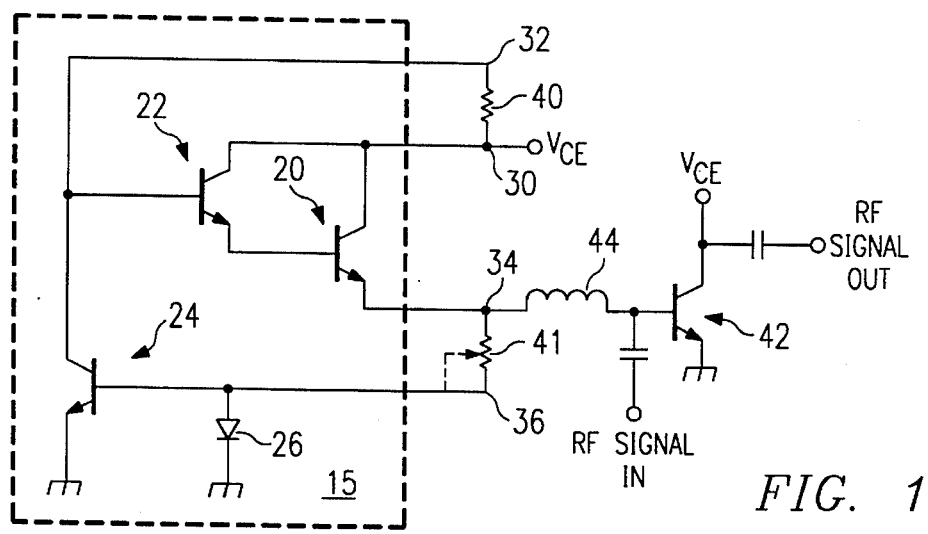
FIG. 1b shows the biasing device of FIG. 1a connected to an RF device for biasing purposes.

Biasing device 15, as shown in FIG. 1a, is an integrated circuit consisting of three specially-processed transistors 20, 22 and 24 and one low turn-on diode 26. FIG. 1b shows biasing device 15 coupled to RF device 42 for the purpose of actively biasing RF device 42. An example of a biasing device can be found in copending, co-owned U.S. patent application Ser. No. 07/932,755 (C. J. Rotay) filed on Aug. 20, 1992 which is herein incorporated by reference.

Biasing device 15, due to the configuration of the specially-processed transistors, provides an exceptionally low-impedance current source with increased sensitivity to changes in the base-emitter voltage of RF device 42 operating in quasi-linear modes. The changes in the base-emitter voltage of RF device 42 are detected instantaneously as voltage variations across resistor 41.

A Darlington pair comprising transistors 20 and 22, in conjunction with transistor 24, provides three distinct advantages. The first advantage is increased sensitivity. The increased sensitivity is afforded by the Darlington emitter-follower configuration (i.e., the loop gain for this stage is increased to the product of the individual gains for transistors 20 and 22). The increased sensitivity allows for tighter control of the bias voltage supplied to RF device 42 as operating parameters change with respect to temperature. The control is tighter because the biasing circuit is more sensitive and responsive to smaller voltage changes. The slightest change in the current driving the Darlington pair is translated/amplified into the required adjustment in output voltage supplied to the base of RF device 42. The ability to respond to slight changes is important because the overall changes in collector current for transistor 24, when detecting voltage changes across resistor 41, are potentially quite small and will likely have only a slight affect on the current driving the Darlington pair.

Second, the Darlington pair which drives the base of RF device 42 (having a voltage drop of approximately 0.7 v) contains two base-emitter voltage drops of its own (the base-emitter junction voltages for transistor 20 and transistor 22 equaling approximately 1.4 v). This means that approximately 2.1 v should be applied at node 32 (which is connected to both base 22b and collector 24c) in order for biasing device 15 to function properly.

In contrast, if the Darlington pair is replaced with a single transistor serving as the emitter follower, only 1.4 v is required at node 32 which, consequently, tends to place transistor 24 deep in the saturation region of its load line. If transistor 24 operates in or too close to its saturation region, it cannot properly amplify the voltage changes detected across resistor 41 because its collector current approaches its maximum value quickly (i.e., the base current for transistor 24 approximately equals the collector current: Ib≡Ic), even with the slightest amount of base drive. This situation leads to degraded control of the bias for RF device 42. A discussion of saturation, cutoff and active regions as well as load lines is found in B. G. Streetman, *Solid State Electronic Devices,* 2nd edition, Prentice-Hall (1980) which is herein incorporated by reference.

Thus, the addition of transistor 22 to the biasing circuit provides an elevated voltage to collector 24c. This elevated voltage is sufficient to shift the operating point of transistor 24 further into its active region, thus, ensuring that transistor 24 does not operate in or too close to its saturation region. While operating in the active region, transistor 24 can accurately amplify the detected voltage variations across resistor 41 as the $V_{be}$ (base-emitter junction voltage) of RF device 42 changes with temperature, thus, providing sufficient and accurate control of the bias point for RF device 42.

It should be noted that even with 2.1 v on the collector of transistor 24, the ability of transistor 24 to amplify detected changes in the $V_{be}$ of RF device 42 is reduced somewhat from the total gain available in its active region (i.e., current gain decreases as saturation is approached). Under exemplary conditions, however, it should also be noted that the current driving base 24b of transistor 24 is very small and varies minutely with temperature (as described above). These minute variations appear at collector 24c, and because collector 24c is directly connected to the Darlington pair at 22b, they can then be greatly amplified as described above.

Although in the exemplary embodiment of the present invention, transistor 22 of the Darlington pair is used to elevate the voltage of collector 24c of transistor 24, it is contemplated that other means could also be employed to elevate the voltage. For example, in place of transistor 22, a diode could be used in place of the Darlingtion pair, thereby adding the necessary extra voltage drops between collector 24c and base 20b (see FIG. 6). Other means for increasing the collector voltage may include additional transistors, one or more resistors, one or more diodes, or an appropriate combination thereof. Such an effort is an attempt to shift the operating point of transistor 24 closer to the midpoint of its respective load line and centered within the active region. It should be noted that the performance of biasing device 15 with a Darlingtion pair is better than if a diode or series of diodes are used.

The third advantage of employing the Darlington pair as an emitter-follower in the exemplary embodiment is the inherent feature that it is an exceptionally low impedance current source. The importance of this characteristic is described above and below.

In addition to the Darlington pair, biasing device 15 employs compensating diode 26. Diode 26 thermally tracks and compensates for a drift in the operating point of transistor 24 due to temperature changes which, if not accounted for, could substantially degrade the overall performance of biasing device 15. To make diode 26 a low turn-on diode for better thermal tracking ability, techniques similar to those employed in the referenced application (Ser. No. 07/932, 755) were used.

Biasing device 15 is capable of supplying a range of current (from nanoAmperes to Amperes) to the base connection of RF device 42 without adversely affecting its ability to track the base-emitter voltage ($V_{be}$) of RF device 42. Some potential adverse effects, which have been minimized by the chosen architectures and specially-processing the transistors in biasing device 15, typically arise from a transistor's internal resistance which cannot only limit its current capabilities but also distort (relative to those of the RF device) the turn-on characteristics of the compensating transistors.

Biasing device 15 provides this range of current while accurately tracking changes in the RF device's $V_{be}$ with respect to temperature. Voltage changes occur due to an intrinsic characteristic of all silicon PN junctions, varying only slightly from device type to device type, which is that the PN junction voltage decreases by 2 to 2.5 millivolts per increase of 1° C. The changing $V_{be}$ causes the operating point of the RF device to drift and, if inaccurately tracked by the biasing device, will likely cause the RF device to enter thermal runaway leading to catastrophic device failure.

Thus, to prevent thermal runaway, biasing device 15 employs an active biasing technique capable of accurately tracking the change in $V_{be}$ (with voltage) for the RF device while satisfying the current requirements of RF device 42 in Both switching and non-switching modes.

For a non-switching RF device, thermal runaway occurs if the bias supply voltage remains constant as the base-emitter junction resistance of the RF device decreases in response to increasing temperature. As the junction resistance decreases, increasing collector current for the RF device is allowed to flow which is dictated by the change in $V_{be}$ and an apparent increase in the RF device's $H_{fe}$. A cycle is created as the increased collector current causes the junction temperature to increase exponentially. Eventually, high fusion currents destroy the device, thus, ending the cycle.

For a switching RF device, the above description applies with some additional concerns. First, the biasing device should have a sufficiently low source impedance in order to source high levels of base current (which increases with increasing RF drive levels) without losing regulation of the RF BJT's bias point.

Second, the biasing device must sense changes in the RF device's junction temperature, and compensate for the change in the $V_{be}$ at any point during the RF cycle, as well as during changes in the RF signal's amplitude.

And, third, the biasing device cannot be susceptible to the rectification effects of the RF BJT's base-emitter junction during which the negative voltage developed opposes the positive bias voltage which tends to lower the bias point of the RF device.

Accurately tracking the base-emitter voltage of RF device 42 while providing a low impedance current source are important features to designers requiring maximum linear performance, stability, easy-to-control operating points, overall quasi-linear amplifier reliability and high system efficiency. In addition to these desirable properties, due to its processing and packaging, the biasing device requires minimal board space and a minimal number of support devices.

B. Construction

As seen in FIG. 1a, in its basic configuration, biasing device 15 consists of three transistors 20, 22 and 24 and one diode 26. Terminal node 30 is connected to collector 20c of transistor 20. Transistors 20 and 22 are connected in a Darlington configuration with emitter 22e connected to base 20b and, collectors 22c and 20c connected together. Terminal node 30 is connected to collectors 20c and 22c. Terminal node 32 is connected to base 22b of transistor 22 as well as collector 24c of transistor 24. Emitter 20e of transistor 20 leads to terminal node 34. Base 24b of transistor 24 is connected to diode 26 as well as to terminal node 36, while emitter 24e of transistor 24 is connected to ground. Terminal nodes 30, 32, 34 and 36 are connected, via wires, to the IC's package leads, hence, they are externally accessible.

As described above, transistors 20 and 22 are in a Darlington configuration which has several advantages. One advantage of this configuration is the additional sensitivity that is achieved relative to using only one transistor (e.g., only transistor 20). A second advantage of this configuration is the additional voltage —0.7 volts—which transistor 22 adds to the voltage at collector 24c (with transistor 22, the total voltage at 24c is approximately 2.1 v rather than 1.4 v without it). And the third advantage is the low impedance current sourcing ability afforded by the Darlingtion pair.

Figure 7:
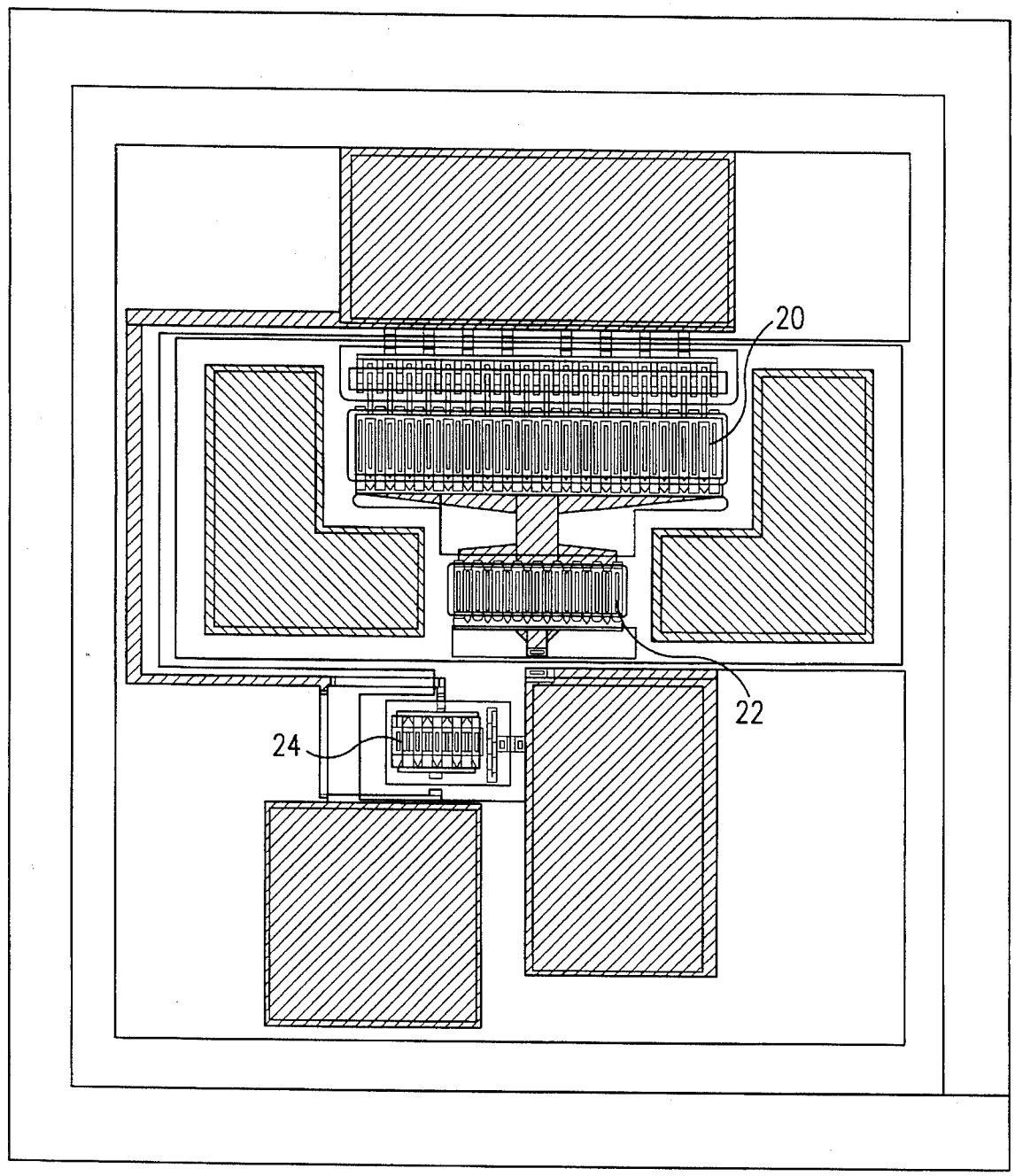
FIG. 7 shows the biasing device of FIG. 1a in the form of a mask layer fabricated simultaneously on the same chip.

In the exemplary embodiment of biasing device 15, transistors 20, 22 and 24 are processed the same. Under other conditions, however, it may be beneficial to modify the relative sizes of the transistors. For instance, transistor 22 and 24 could be fabricated smaller due to reduced power handling requirements. Another example may involve different size transistors on a single chip as in FIG. 7. These modifications are acceptable as long as the following processing techniques and special procedures are substantially followed.

Since transistors 20, 22 and 24 are processed the same, for the sake of clarity, the following description focuses on the fabrication of transistor 20.

Transistor 20 is specially-processed and selected for suitable operation in an emitter-follower configuration having extremely low source impedance, as required by an ideal current source. Transistor 20 has an internal resistance of approximately 100 milliOhms and an $H_{fe}$ of 35.

Figure 2:
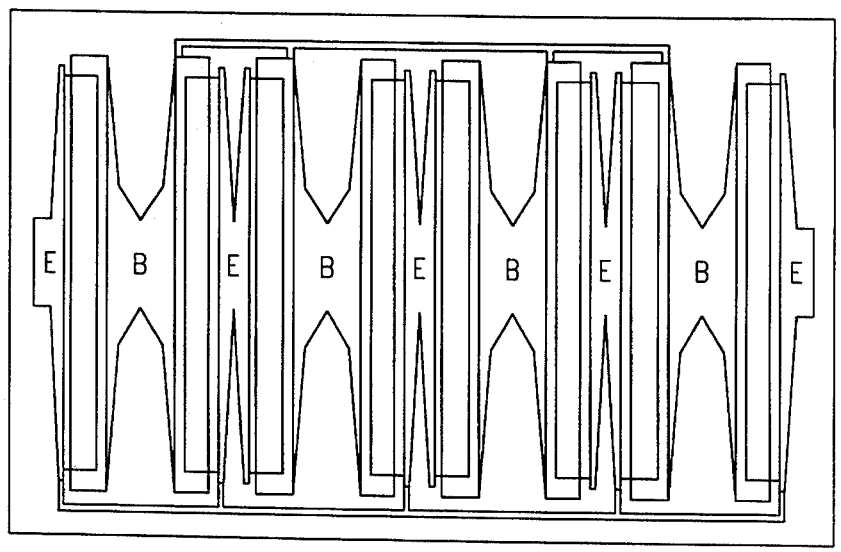

The top level mask of transistor 20 employs a conventional diamond matrix architecture, as seen in FIG. 2, and consists of refractory gold metallization and large bond pad areas for gold wirebonding. Bonding areas are designated by "E" for emitter connections and "B" for base connections. The collector connection for this type of RF transistor is the entire underside (not shown) which consists of a barrier metal layer of tungsten which allows gold to be plated to the wafer. The two step process involves high voltage sputtering of the barrier metal onto the silicon substrate, which prevents the highly porous gold backside from diffusing into the silicon, thus, destroying previously created junctions. The gold is then electroplated to barrier metal using standard techniques. The backside gold metallization allows the completed transistor die to be eutectically attached to the gold metallization within the package.

The above metallization steps follow numerous processing steps involving photolithography techniques to develop base and emitter regions from layer masks onto the starting substrate (N type collector region). This is accomplished by exposing photoresist which allows particular areas to remain while others are etched away. The layer masks are used in sequence to form base and emitter regions, where, after etching, a P or N type dopant (respectively) is introduced at specific levels of concentration. After contacts to the base and emitter regions through insulating barriers of oxide are formed, connections to the top metal layers complete the fabrication of the transistors. These apply to both NPN and PNP BJT's; however, the exemplary embodiment of biasing device 15 involves NPN BJT's.

Some distinguishing characteristics of biasing device 15 are inherent in the geometry of transistor 20, while others are introduced at specific points during fabrication of transistor 20. The geometry of transistor 20, was chosen for its high emitter periphery, specifically for the high number of base-emitter junctions throughout the chip, which provides low source impedance and, consequently, high current capability.

Additionally, the diffusion of the emitter into the base region was specifically processed for a low forward voltage drop which further lowers the impedance by reducing the junction's internal resistance. Also, the base diffusion for this die type is exceptionally large (i.e., high base area) and has a wide depletion region. This translates into inherent stability even at low frequencies by reducing gain, thereby reducing the likelihood of oscillations.

Finally, the substrate (starting material) of transistor 20 contains thick, high resistivity epitaxial layers which give the collector region a high breakdown voltage. This decreases the collector to emitter leakages (which tend to forward bias the RF transistor), thus extending the operating voltage range of biasing device 15. In fact, the breakdown voltage is high enough to allow biasing device 15 to operate at the normal operating voltages of today's linear RF transistors. This affords advantages in both reliability and versatility.

Figure 4:
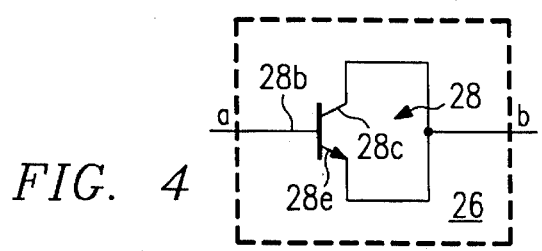

In the exemplary embodiment of biasing device 15, as seen in FIG. 4, diode 26 is actually processed like a transistor, as represented by transistor 28; however, collector 28c is connected to emitter 28e of transistor 28 which contributes to the low turn-on characteristics of diode 26. It should be noted that in FIGS. 1a and 4, labels "a" and "b" have been used to indicate the proper orientation of diode 26.

Figure 5A:
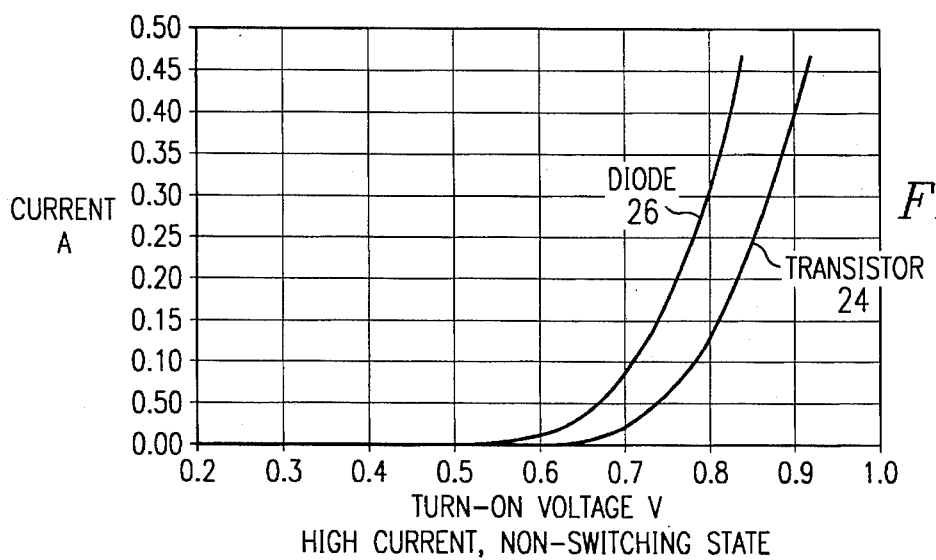
FIG. 5a shows a comparison between the base-to-emitter characteristic curve of the diode of FIG. 1a versus that of the transistor for which it is compensating.
Figure 5B:
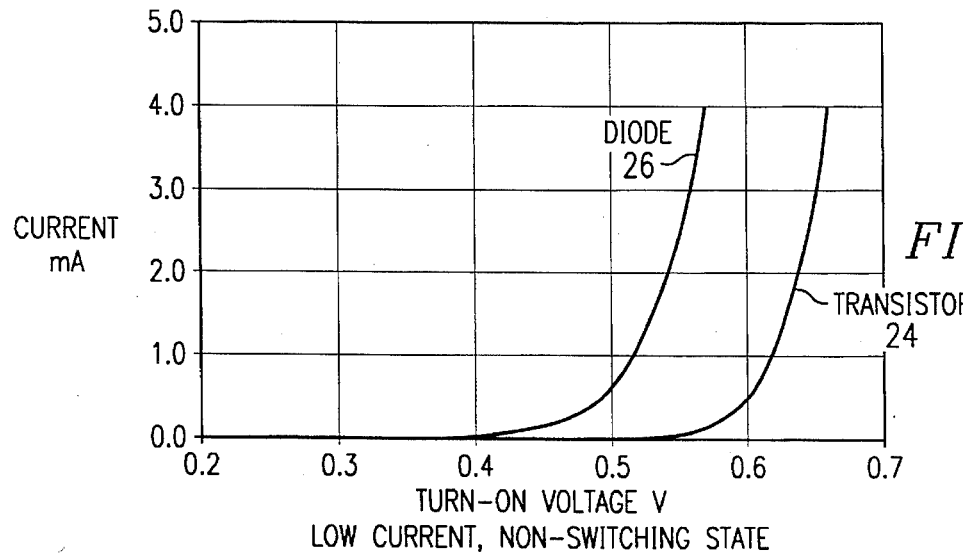
FIG. 5b shows a similar comparison to FIG. 5a at low current.

The relative characteristics of diode 26 and transistor 24 are illustrated in FIGS. 5a and 5b. These relative characteristics are advantageous because diode 26 turns on at a voltage slightly less than the voltage needed to bias transistor 24 to its quiescent level. As seen in FIGS. 5a and 5b, the voltage difference is approximately 0.05 to 0.1 volts. This ensures that diode 26 is on and operating before transistor 24 which is advantageous in that the slightest unrelated change to the bias of transistor 24 (e.g., a change in temperature) can disrupt the operation of biasing device 15. Thus, if diode 26 is on before transistor 24, it can compensate for transistor 24 continuously throughout its operation.

Transistor 28 is fabricated similar to that of transistors 20, 22 and 24 except as described below.

Figure 3:
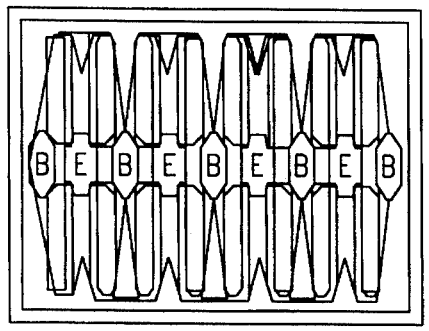

The top level masks of transistor 28 employs a conventional interdigitated architecture as seen in FIG. 3. The geometry of transistor 28 is chosen for its thermal tracking capability. Because this architecture mimics that used in standard RF devices, the ability of diode 26 to compensate for transistor 24 is inherently enhanced.

This occurs for several reasons. First, the interdigitated geometry is dense and symmetrical which is critical to proper current sharing which, in turn, is necessary for optimal compensation.

Second, because the base and emitter regions of transistor 28 are geometrically the same as those of transistor 24, the base-emitter characteristic curve of transistor 28 closely resembles that of transistor 24.

Third, the intentional polysilicon emitter ballast (or internal resistance) for transistor 28 is processed using the same techniques used for standard RF devices, although the level of the total junction resistance for transistor 28 is lower for reasons described below.

The geometry chosen for transistor 28 also incorporates a large number of active areas having high quantities of base and emitter fingers. The fingers significantly increase the emitter periphery and, when coupled with the paralleled junctions, increases the current handling capability, thereby extending the useful operating range of biasing device 15.

In addition to the geometry, certain processing modifications for transistor 28 are important to achieve optimal compensation characteristics.

First, the processing begins with lower resistivity starting material (lower relative to transistor 24) translating to lower junction breakdown voltages. This means that the junctions, in particular the base-emitter, of transistor 28 behave similarly to those of transistor 24, but will generally begin to breakdown at slightly lower voltages.

Additionally, the emitter resistance of transistor 28 is intentionally lowered during the ballast processing step to further ensure lower-voltage turn on characteristics. This is accomplished by using the lowest ballasting necessary to promote equal current sharing between active areas.

Finally, because transistor 28 is connected (as described above) in such a way that the base-collector junctions are in parallel with the base-emitter junctions (contributing to the formation of low turn-on diode 26), normal transistor action ceases. This means that the $H_{fe}$ of transistor 28 is no longer a concern, hence, allowing for much simpler ion implantations of dopant into the base and emitter regions during processing. This significantly improves overall device yields.

The low turn-on characteristic of the effective diode 26 is important for proper compensation of transistor 24. The low voltage turn-on of diode 26 allows it to track the turn-on characteristic curve of transistor 24 at a proportionally lower voltage, as seen In FIGS. 5a and 5b. This ensures that diode 26 is turned on by the time transistor 24 is biased at higher quiescent levels. Consequently, it provides linear compensation of the change in $V_{be}$ within transistor 24 at all operationg points.

Additionally, the turn-on characteristics of diode 26 tend to account for and cancel out changes in the ambient temperature of biasing device 15 relative to RF device 42. Because RF device 42 is controlled/biased with the voltage feedback, increased temperatures, whether generated by RF device 42 or otherwise, should not influence the ability of biasing device 15 to control/bias. Without the compensation provided by diode 26, the quiescent current provided to the base of RF device 42 may be reduced by biasing device 15 due to the adverse effects of the increased ambient temperature on transistor 24.

The above features offer enhancements in all major performance areas, for instance, linearity and intermodulation distortion, stage gain, and amplifier stability. Because biasing device 15 is designed for low current consumption, especially when compared to other transistor biasing techniques, system efficiency can dramatically increase.

Biasing device 15 is provided in a single package. In addition to sensing the voltage changes of the base-emitter junction of RF device 42, efficient active biasing by biasing device 15 can be enhanced by accurately sensing the temperature of the RF device, thus, the package should be thermally conductive. Additionally, the package, although not required, should be positioned in the same thermal plane and, preferably, in close proximity to the RF device (in the exemplary embodiment of a biasing device 15, this distance is approximately within 2–3 inches of the RF device). It should be noted that the closer the biasing device 15 is positioned relative to the RF device, the faster it can compensate due to the changes in temperature and voltage.

In the exemplary embodiment of biasing device 15, the package includes a thermally conductive copper base and/or flange and a non-hermetically sealed ceramic lid. Also, the footprint of the package should be sufficiently large in area such that adequate thermal conductivity occurs.

C. Use and Operation

In use, terminal node connections 30, 32, 34 and 36 are used in the following way:

Terminal node 30 is the positive voltage supply ($+V_{ce}$). In the exemplary embodiment, terminal node 30 is capable of being operated at any $V_{ce}$ of the RF device from 5 v to 50 v. This is a significant increase in range relative to existing devices.

Terminal node 32 is the bias adjust voltage. The voltage applied to this node should be selected such that transistors 20 and 22 are forward biased. It should be noted that this is most easily accomplished with a variable resistor in rheostat configuration; and, with simple computations, a fixed resistor can permanently set the bias point.

Terminal node 34 is the base bias voltage. This is the output of the biasing device which provides a voltage and temperature compensated base voltage to the RF device with dynamic current capability. This voltage is calculated by $V_{rfbe} - \Delta V_{be}$.

Referring back to FIG. 1b, biasing device 15 is coupled to RF device 42 for biasing purposes. A variable resistor 40 is connected between terminal nodes 30 and 32. A feedback resistor 41 is connected between terminal nodes 34 and 36. It should be noted that, in the exemplary embodiment, feedback resistor 41 is a predetermined value and not implemented using a variable resistor. Terminal node 34 is also connected to an inductor 44 which, in turn, is connected to the base 42b of RF device 42. Inductor 44 performs the function of an RF choke.

In operation, a user should select the appropriate values for resistor 40 and feedback resistor 41 such that RF device 42 is properly biased and an equilibrium is achieved with respect to temperature. As understood by those skilled in the art, there are numerous ways for calculating appropriate values for resistors 40 and 41, each of which depends on the particular application.

As RF device 42 operates, its temperature increases. The temperature increase causes the base-emitter junction voltage of RF device 42 to decrease at a rate of approximately 2 millivolts/°C. A related decrease in voltage occurs across feedback resistor This decrease causes an increased voltage at base 24b of transistor 24. The increased base voltage translates into increased current flowing from collector 24c to emitter 24e of transistor 24 and a decrease in voltage at base 22b of transistor 22. The decrease in voltage at base 22b translates into decreased voltage at base 20b of transistor 20. The decreased voltage at base 20b causes the corrected voltage ($V_{corr}$ which is equal to $V_{rfbe}-\Delta V_{be}$) to appear at the base of RF device 42. This occurs as transistor 20 Sources any amount of current, as required by quasi-linear transistor action, to the base of RF device 42. Thus, by sensing the decrease in base voltage of RF device 42 using feedback resistor biasing device 15 allows the base-emitter junction voltage of RF device 42 to decrease while continuously adjusting the base bias voltage which corresponds to the proper amount of quiescent current. The quiescent current conditions of RF device 42 are pre-determined and occur at a particular base voltage which changes only with temperature.

In the above case, because diode 26 is used to compensate for changes, due to temperature, in the base-emitter voltage of transistor 24, if no temperature changes occur then diode 26 does not effect the operation of the remainder of biasing device 15.

However, if temperature changes occur for biasing device 15, whether it is in the same thermal plane of RF device 42 or not, the operation of biasing device 15 could be adversely affected.

First, as an example, take the case where biasing device 15 does not include diode 26 and its temperature begins to rise. As the temperature increases, the base-emitter junction voltage of transistor 24, as well as its resistance, decreases. Consequently, because the voltage at base 24b has been set, increased collector current will flow. This increased collector current, for transistor 24, is a precursor to thermal runaway. As described above, the voltages through the Darlingtion starting at base 22b are reduced, thereby tending to turn off RF device 42. Thus, a temperature change at biasing device 15, particularly at transistor 24, can adversely affect the supply of current to the base of RF device 42 by unintentionally decreasing the corrected output voltage (such that $V_{corr}$ less than $V_{rfbe}-\Delta V_{be}$) and, therefore, the overall operation of RF device 42.

Under the same conditions, if diode 26 is included the result is different. As was the case above, as the temperature increases, the base-emitter junction voltage of transistor 24, as well as its resistance, decreases. However, with diode 26 in place, the junction voltage of diode 26 as well as its resistance also decreases. This means that the voltage at base 24b is gradually lowered by diode 26 at a rate of 2 mv/°C. In this way, the current through collector 24c remains unaffected by temperature variations in transistor 24. Consequently, following the logic of the above description, there is a minimal impact on the base voltage of transistor 22 and, hence, minimal, if any, impact on the overall operation of RF device 42.

Thus, by controlling an otherwise unknown variable in the control loop of biasing device 15, an increase in efficiency and reliability for the overall biasing device is achieved.

It should be noted that, when biasing an RF device, proper bypassing and filtering techniques, well-known by those skilled in the art, should be used. Standard bypassing techniques are satisfactory for this circuit. Also, additional filtering should be considered when long lead lengths or connection runs are used.

D. Alternate Embodiments

Figure 6:
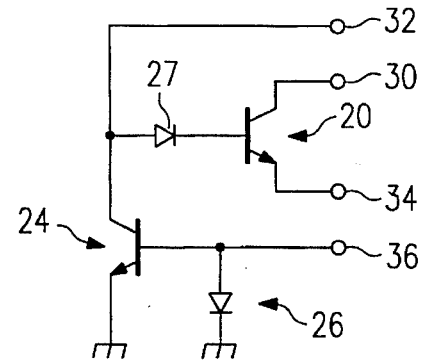

FIG. 6 shows an alternate embodiment for biasing device 15. Biasing device 15b, instead of having the Darlington configuration of FIG. 1a, employs a diode 27, for the purpose of increasing the voltage at collector 24c to provide sufficient voltage (i.e., headroom) such that transistor 24 does not operate in saturation. It should be noted that, depending on the overall circuit configuration, additional diodes can be added in series with diode 27 to provide an adequate voltage at collector 24c for the reasons set forth above.

Although the invention is illustrated and described herein embodied as a biasing device, the invention is nevertheless not intended to be limited to the details as shown. Rather, various modifications may be made in the details within the scope and range of equivalents of the claims and without departing from the spirit of the invention.

What is claimed:

1. A biasing device for actively biasing the base of an RF device operating in quasi-linear modes, said biasing providing a source of low impedance current and high current capability, comprising:

first and second transistors each having a collector, an emitter and a base;

the base of said first transistor connected to the collector of said second transistor;

a third transistor having a collector, an emitter, and a base, connected to said first transistor in a Darlington configuration and directly connected between the base of the first transistor and the collector of the second transistor, for increasing the voltage at the collector of the second transistor in order to keep the second transistor out of saturation; and the emitter of said first transistor being connected (1) by way of a resistor to the base of the second transistor and (2) to the base of the RF device, for actively biasing the base of the RF device when operating in a quasi-linear mode, thereby providing a source of low impedance current and high current capability, whereby said third transistor prevents the second transistor from operating in saturation.

2. The biasing device according to claim 1, wherein the collector of said second transistor is resistively connected to the collector of said first transistor and to the collector of said third transistor.

3. The biasing device of claim 1, wherein the emitter of said third transistor is resistively connected to the base of said second transistor.

4. A biasing device for actively biasing the base of an RF device operating in quasi-linear modes, said biasing device providing a source of low impedance current and high current capability, comprising:

first and second transistors each having a collector, an emitter, and a base;

means, directly connected between the base of the first transistor and the collector of the second transistor, for increasing the voltage at the collector of the second transistor and for preventing the second transistor from operating in saturation; and the emitter of said first transistor being resistively connected (1) to the base of the second transistor and (2) to the base of the RF device.

5. The biasing device according to claim 4, wherein said means for increasing is at least one diode having an anode and a cathode.

6. The biasing device according to claim 5, wherein the collector of the second transistor is connected to the anode of the diode and is resistively connected to the collector of the first transistor.

7. The biasing device according to claim 4, further comprising a diode connected between the base of said second transistor and ground in order to thermally compensate for said second transistor.

8. The biasing device according to claim 7, wherein said diode is constructed as a third transistor having a base, a collector, and an emitter with the collector and the emitter directly connected to each other.

9. The biasing device according to claim 8, wherein said first and second transistors each are constructed with a diamond-matrix transistor architecture and said third transistor is constructed with an interdigitated transistor architecture.

* * * * *